United States Patent
Huang et al.

(10) Patent No.: US 10,811,660 B2
(45) Date of Patent: Oct. 20, 2020

(54) SEPARATOR, METHOD FOR PREPARING SEPARATOR AND ELECTROCHEMICAL DEVICE CONTAINING SEPARATOR

(71) Applicant: Contemporary Amperex Technology Co., Limited, Ningde, Fujian Province (CN)

(72) Inventors: Huafeng Huang, Ningde (CN); Qisen Huang, Ningde (CN); Shiwen Wang, Ningde (CN); Chengdu Liang, Ningde (CN)

(73) Assignee: Contemporary Amperex Technology Co., Limited (CN)

(*) Notice: Subject to any disclaimer, the term of this patent is extended or adjusted under 35 U.S.C. 154(b) by 117 days.

(21) Appl. No.: 16/211,526

(22) Filed: Dec. 6, 2018

(65) Prior Publication Data

US 2019/0207191 A1    Jul. 4, 2019

(30) Foreign Application Priority Data

Dec. 29, 2017 (CN) .......................... 2017 1 1486159

(51) Int. Cl.
| | |
|---|---|
| H01M 2/16 | (2006.01) |
| H01M 2/14 | (2006.01) |
| H01M 10/0525 | (2010.01) |
| C23C 14/00 | (2006.01) |
| C23C 14/02 | (2006.01) |
| C23C 14/08 | (2006.01) |
| C23C 14/28 | (2006.01) |

(52) U.S. Cl.
CPC ....... *H01M 2/1686* (2013.01); *C23C 14/0021* (2013.01); *C23C 14/028* (2013.01); *C23C 14/081* (2013.01); *C23C 14/28* (2013.01); *H01M 2/145* (2013.01); *H01M 2/162* (2013.01); *H01M 2/1626* (2013.01); *H01M 2/1646* (2013.01); *H01M 2/1653* (2013.01); *H01M 10/0525* (2013.01)

(58) Field of Classification Search
CPC ....... H01M 2/14; H01M 2/16; H01M 10/0525
See application file for complete search history.

(56) References Cited

U.S. PATENT DOCUMENTS

| | | | | |
|---|---|---|---|---|
| 2,673,230 A | * | 3/1954 | Brennan | ............. H01M 2/1653 |
| | | | | 429/137 |
| 2013/0143146 A1 | | 6/2013 | Huang et al. | |
| 2013/0337312 A1 | | 12/2013 | Park et al. | |
| 2017/0162855 A1 | | 6/2017 | Kim et al. | |
| 2017/0373295 A1 | | 12/2017 | Kim et al. | |

FOREIGN PATENT DOCUMENTS

WO    WO2016196264 A1    12/2016

\* cited by examiner

*Primary Examiner* — Kenneth J Douyette
(74) *Attorney, Agent, or Firm* — Forge IP, LLC

(57) ABSTRACT

A separator, a method for preparing the separator, and an electrochemical device containing the separator. The separator includes a substrate and an inorganic layer disposed on at least one side of the substrate. The substrate is a porous substrate. The inorganic layer is a dielectric layer containing no binder. The inorganic layer has a thickness of 20 nm to 2000 nm. A mass of the inorganic layer is M1, a mass of the substrate is M2, and M1/M2 is greater than or equal to 0.05 but smaller than or equal to 7.5. An interfacial peeling force between the inorganic layer and the substrate is not smaller than 30 N/m. The interfacial wettability and thermal shrinkage resistance performance of the separator are effectively improved while the separator has a certain mechanical strength. The separator can have favorable mechanical strength and thermal shrinkage percentage and high energy density.

20 Claims, No Drawings

SEPARATOR, METHOD FOR PREPARING SEPARATOR AND ELECTROCHEMICAL DEVICE CONTAINING SEPARATOR

CROSS-REFERENCE TO RELATED APPLICATIONS

The present application claims priority to Chinese Patent Application No. 201711486159.9, filed on Dec. 29, 2017, the content of which is incorporated herein by reference in its entirety.

TECHNICAL FIELD

The present disclosure relates to the field of energy storage and, in particular, relates to a separator, a method for preparing the separator and an electrochemical device containing the separator.

BACKGROUND

In the internal structure of the battery, the separator, as a key component, is usually a porous polymer film, which has the characteristics of electron isolation and ion conduction, and is used for normal transmission of ions between a positive electrode and a negative electrode without short circuit. In recent years, in order to solve the problems of high thermal shrinkage and poor electrolyte wettability of a single polymer separator, a composite separator prepared by coating a ceramic coating layer on a surface of a polymer substrate has become a key technology to improve the safety performance of the battery. Forming an organic-inorganic composite coating layer by mixing inorganic particles and a binder can modify the surface of the polymer substrate. However, there are still some problems about such a composite separator that are needed for further research and development.

For example, it is difficult to form a coating layer with a nano-scale thickness due to process constraints and requirements on technical effect. In addition, since bonding between the inorganic particles and the polymer substrate material is mainly achieved by the binder, bonding forces in different regions are significantly affected by the distribution of the binder. As a result, during the coating process, long-term cycling or battery abuse, the coating layer on the separator surface may easily occur cracks, aging, porosity changing, or detachment of ceramic particles and the like, thereby leading to deterioration of ion conduction performance and even cause security problems in severe cases.

SUMMARY

In view of this, a first aspect of the present disclosure provides a separator. The separator includes a substrate with a porous structure and an inorganic layer arranged on at least one side of the substrate. The substrate is a porous substrate having a plurality of pores. The inorganic layer is a dielectric layer containing no binder. A thickness of the inorganic layer is 20 nm to 2000 nm, a mass of the inorganic layer is M1, a mass of the substrate is M2, and a mass ratio of the inorganic layer to the substrate M1/M2 is greater than or equal to 0.05 but smaller than or equal to 7.5, and an interfacial peeling force between the inorganic layer and the substrate is not smaller than 30 N/m.

A second aspect of the present disclosure provides a method for preparing the separator of the first aspect. The method includes at least steps of: providing a substrate, which is a porous substrate having a plurality of pores; and forming an inorganic layer on a surface of the substrate and in the pores by means of vapor deposition, so as to obtain the separator.

A third aspect of the present disclosure provides an electrochemical device including a positive electrode, a negative electrode, a separator, and electrolyte. The separator is the separator of the first aspect.

The technical solutions of the present disclosure have at least the following beneficial effects:

By providing an ultra-thin inorganic layer containing no binder on the surface of the porous substrate, the interfacial wettability and thermal shrinkage resistance performance of the separator can be effectively improved while the separator has a certain mechanical strength. By controlling the mass ratio of M1/M2 and the value of the interfacial peeling force within a proper range, respectively, the separator can have favorable mechanical strength and thermal shrinkage percentage while having high energy density. In addition, since there is no binder between the substrate and the inorganic layer, the inorganic layer is prevented from cracking and falling-off caused by the uneven distribution of the binder, and the problems of decrease of mechanical strength and blockage of pores caused by the falling-off can be alleviated, thereby improving safety performance and cycling life of the battery.

DESCRIPTION OF EMBODIMENTS

The present disclosure is further described with reference to embodiments and comparative examples. These embodiments are merely for illustrating the present disclosure rather than limiting the present disclosure. Any modification or equivalent replacement to the technical solutions of the present disclosure, without departing from the scope of the technical solutions of the present disclosure, shall fall into the protection scope of the application.

First of all, a first aspect of the embodiments of the present disclosure provides a separator.

The separator includes a substrate and an inorganic layer arranged on at least one side of the substrate. The substrate is a porous substrate having a plurality of pores. The inorganic layer is a dielectric layer containing no binder. The inorganic layer has a thickness of 20 nm to 2000 nm. A mass of the inorganic layer is M1, a mass of the substrate is M2, and a mass ratio of the inorganic layer to the substrate M1/M2 is greater than or equal to 0.05 but smaller than or equal to 7.5. An interfacial peeling force between the inorganic layer and the substrate is not smaller than 30 N/m.

In the composite separator according to the first aspect of the embodiments of the present disclosure, since the ultra-thin inorganic layer is provided, the interfacial wettability and the thermal shrinkage resistance performance of the separator are effectively improved. When the mass ratio of M1/M2 is in the range of 0.05~7.5, the separator has favorable mechanical strength and thermal shrinkage percentage while having high energy density. However, when a mass of the inorganic layer is further increased, the hydrophilicity to the separator, thermal shrinkage resistance performance and mechanical strength of the separator are not further significantly improved. Instead, it may reduce the porosity of the inorganic layer on the surface of the separator, increase the ion transmission distance, and affect the rapid transmission of ions between the positive and negative electrodes, thereby causing deterioration of the dynamic properties of the cell. In addition, since there is no binder between the substrate and the inorganic layer, the problems such as cracking and falling-off of the inorganic layer due to the uneven distribution of the binder can be avoided, and the problems of mechanical strength reduction and pore blocking of the substrate caused by the falling-off that deteriorates the ion conductivity of the battery can be also avoided. Therefore, the safety performance and the cycling life of the battery can be further improved.

As an improvement to the separator of the embodiments of the disclosure, an upper limit of a thickness of the inorganic layer can be 2000 nm, 1900 nm, 1800 nm, 1700 nm, 1600 nm, 1500 nm, 1400 nm, 1300 nm, 1200 nm, 1100 nm, 1000 nm, 990 nm, 950 nm, 900 nm, 850 nm, 800 nm, 750 nm, 720 nm, 700 nm, 680 nm, 650 nm, 600 nm 550 nm, or 500 nm. A lower limit of the thickness of the inorganic layer can be 20 nm, 30 nm, 40 nm, 45 nm, 50 nm, 55 nm, 60 nm, 70 nm, 80 nm, 90 nm, 100 nm, 110 nm, 150 nm, 200 nm, 250 nm, 280 nm, 300 nm, 350 nm, 380 nm, 400 nm, 430 nm, 450 nm, or 490 nm. The range of the thickness of the inorganic layer can be constituted by any of the upper limits and any of the lower limits.

As an improvement to the separator of the embodiments of the disclosure, an upper limit of M1/M2 can be 7.5, 7.2, 7.0, 6.8, 6.5, 6.3, 6.0, 5.8, 5.5, 5.3, 5.0, 4.8, 4.5, 4.3, 4.0, 3.8, 3.5, 3.3, 3.1, or 3.0. A lower limit of M1/M2 can be 0.05, 0.09, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, or 2.9. The range of M1/M2 can be constituted by any of the upper limits and any of the lower limits. If the value of M1/M2 is too small, the amount of the inorganic layer is small relative to the porous substrate and the coating is insufficient. When heated, the restriction against thermal shrinkage of the porous substrate by the inorganic layer is weak, and the inhibition effect against the thermal shrinkage of the separator is not significant while the composite membrane has low mechanical strength (such as small tensile strength, small puncture strength, etc.). If the value of M1/M2 is too large, the improvements on hydrophilicity, thermal shrinkage resistance performance, and mechanical strength of the separator are not significant enhanced, and instead, the thickness of the separator can be increased, and the dynamic performance and energy density of the separator can be deteriorated.

As an improvement of the separator of the embodiments of the disclosure, the interfacial peeling force can be 30 N/m, 32 N/m, 34 N/m, 36 N/m, 38 N/m, 40 N/m, 42 N/m, 44 N/m, 46 N/m, etc. The separator is soaked in the electrolyte throughout the life cycle of the battery, and thus the interface between the coating layer and the porous substrate is deteriorated by acid/alkali corrosion in the electrolyte, resulting in decrease in the bonding force between the film layers. If the bonding force between the porous inorganic dielectric layer and the substrate bonding force is smaller than 30 N/m, it means that bonding force is insufficient, and the porous inorganic dielectric layer readily falls off in the long term cycling or battery abuse situations, which not only causes the risk of blocking the pores of the substrate and reducing the ion conductivity of the battery, but also causes a series of safety problems.

As an improvement to the separator of the embodiments of the disclosure, the thickness of the inorganic layer is 50 nm to 1500 nm, preferably 100 nm to 1000 nm, and more preferably 150 nm to 500 nm. In the above range, the composite separator can be formed by using an ultra-thin inorganic layer and the porous substrate, and the formed composite separator not only has good wettability to electrolyte and almost no thermal shrinkage at 90° C., but also has good mechanical strength and high air permeability. Compared with a porous substrate having a thickness of ten to tens of microns, the ultra-thin inorganic layer almost does not increase the thickness of the separator, which facilitates improving the energy density of the battery.

As an improvement to the separator of the embodiments of the present disclosure, the inorganic layer is in a porous structure, and a porosity of the inorganic layer is 10%~60%, preferably 20%~40%. An upper limit of the porosity can be 60%, 58%, 55%, 53%, 50%, 48%, 45%, 43%, 40%, 38%, or 35%, and a lower limit of the porosity can be 10%, 13%, 15%, 18%, 20%, 23%, 25%, 28%, 30%, or 32%. The range of the porosity of the inorganic layer can be constituted by any of the upper limits and any of the lower limits. If the porosity of the inorganic layer is too small, it will lead to a lower air permeability of the separator and thus adversely affect the ion transmission properties, resulting in poor dynamic performance of the battery. If the porosity of the inorganic layer is too large and the inorganic layer is too loose, it will adversely affect the mechanical properties of the separator, thereby reducing the reliability of battery in the long-term use.

The porosity of the inorganic layer is measured in a manner as follows. A porous substrate is cut into two pieces of original substrate film samples with an identical area, one piece does not undergo any treatment, and the other piece is prepared with an inorganic layer. The two pieces are dried at 105° C. in a vacuum drying oven for 2 hours and then taken out and placed in a desiccator for cooling to be tested. Then each sample is wrapped evenly by an A4 paper, tiled on a cutting die, and punched by a punching machine, so that the sample is well prepared for testing. Firstly, a ten thousandth micrometer is used to measure the thickness of the sample, and an apparent volume of the sample is calculated based on a surface area and the thickness of the sample. The apparent volumes of the bare porous substrate and the porous substrate prepared with the inorganic layer are denoted as V1 and V2, respectively. Then, an AccuPyc II True Density Meter is used to measure true volume of the sample, and true volumes of the bare porous substrate and the porous substrate prepared with the inorganic layer are denoted as V3 and V4, respectively. The porosity of the inorganic layer can be calculated as $[V2-V4-(V1-V3)]/(V2-V1)*100\%$.

As an improvement to the separator of the embodiments of the present disclosure, the inorganic layer is arranged on at least one surface of the substrate and at least a portion of inner walls of the pores of the substrate. Specifically, the inorganic layer can cover the upper surface or the lower surface of the substrate and a portion of inner walls of the pores in the upper surface or lower surface; or the inorganic layer can cover both the upper and lower surfaces of the substrate and a portion of inner walls of the pores in the upper and lower surfaces of the substrate; or the inorganic layer can fully cover the upper and lower surfaces, and inner walls of the pores in the upper and lower surfaces of the substrate.

As an improvement to the separator of the embodiments of the disclosure, a ratio of a depth of the inorganic layer in a pore of the substrate to the thickness of the substrate is d, and d is in a range of 1/1000 to 1/20, preferably 1/200 to 1/40. An upper limit of d can be 1/20, 1/22, 1/24, 1/26, 1/28, 1/30, 1/32, 1/35, 1/40, 1/50, 1/60, 1/70, 1/80, or 1/90; and a lower limit of d can be 1/1000, 1/900, 1/800, 1/700, 1/600, 1/500, 1/400, 1/300, 1/200, or 1/100. The range of d can be constituted by any of the upper limits and any of the lower limits. The ratio of the depth of inorganic layer in the pore of the substrate is related to the porosity of the substrate, the pore diameter, the process time used in preparing the inorganic layer, concentration of the vapor source, vapor flow rate, etc. When the depth of the inorganic layer in the pore of the substrate is too large (e.g., larger than 1/20 of the thickness of the substrate), the periphery of the pores of the substrate will be easily blocked by the large amount of the inorganic layer, resulting in deterioration of the ion conduction performance of the electrochemical device. If the depth of the inorganic layer in the pores of the substrate is too small (e.g., smaller than 1/1000 of the thickness of the substrate), there will be lots of polymer surfaces exposed in the pores. Therefore, when heated, since the interior of the substrate is subjected to almost no constraints of the inorganic layer, the improvement against the thermal shrinkage is not significant.

As an improvement to the separator of the embodiments of the present disclosure, the inorganic layer contains at least one of aluminum oxide, aluminum nitride, aluminum fluoride, silicon oxide, silicon nitride, silicon fluoride, titanium oxide, titanium nitride, titanium fluoride, zinc oxide, zinc nitride, zinc fluoride, magnesium oxide, magnesium fluoride, magnesium nitride, zirconium oxide, zirconium nitride, zirconium fluoride, calcium oxide, calcium fluoride, calcium nitride, barium oxide, barium fluoride, barium nitride, or AlO (OH).

As an improvement to the separator of the embodiments of the present disclosure, the substrate contains a material selected from a group consisting of polyethylene, polypropylene, polyvinylidene fluoride, aramid fiber, polyethylene glycol terephthalate, polytetrafluoroethylene, polyacrylonitrile, polyimide, polyamide, polyester, natural fiber, or any combination thereof.

As an improvement to the separator of the embodiments of the present disclosure, porosity of the substrate is 20%~80%, preferably 40%~70%. An upper limit of the porosity of the substrate can be 80%, 78%, 75%, 73%, 70%, 68%, 65%, 63%, 60%, 58%, 55%, 53%, or 50%; and a lower limit of the porosity of the substrate can be 20%, 25%, 28%, 30%, 32%, 35%, 38%, 40%, 43%, 45%, or 48%. The range of the porosity of the substrate can be constituted by any of the upper limits and any of the lower limits. Since the inorganic layer could be deposited on the upper and lower surfaces and at least a portion of inner walls of the pores, in order to ensure that the separator has good ion conductivity performance, it is necessary to improve the porosity of the substrate, thereby ensuring pores of the substrate are not be blocked and avoiding the reduced dynamic performance of the battery.

As an improvement to the separator of the embodiments of the present disclosure, a pore diameter of the pore of the substrate is 0.01 μm to 0.5 μm, preferably 0.05 μm to 0.2 μm. An upper limit of the pore diameter can be 0.5 μm, 0.45 μm, 0.4 μm, 0.35 μm, 0.3 μm, 0.25 μm, 0.2 μm, or 0.15 μm; and a lower limit of the pore diameter can be 0.01 μm, 0.02 μm, 0.03 μm, 0.04 μm, 0.05 μm, 0.06 μm, 0.07 μm, 0.08 μm, 0.09 μm, or 0.1 μm. The range of the pore diameter can be constituted by any of the upper limits and any of the lower limits. Since the inorganic layer could be deposited on at least one surface of the substrate and at least a portion of inner walls of the pores in the surface, in order to ensure that the separator has good ion conductivity performance, it is necessary to improve the pore diameter of the substrate, thereby preventing the pores of the substrate from being blocked by the inorganic layer.

As an improvement to the separator of the embodiments of the present disclosure, the substrate has a thickness of 5 μm to 50 μm, preferably is 7 μm to 20 μm, more preferably 7 μm to 15 μm. An upper limit of the thickness of the substrate can be 50 μm, 48 μm, 45 μm, 43 μm, 40 μm, 38 μm, 35 μm, 33 μm, 30 μm, 28 μm, 25 μm, 23 μm, 22 μm, or 20 μm; and a lower limit of the thickness of the substrate can be 5 μm, 8 μm, 10 μm, 12 μm, 15 μm, or 18 μm. The range of the thickness of the substrate can be constituted by any of the upper limits and any of the lower limits.

As an improvement to the separator of the embodiments of the present disclosure, the air permeability of the separator is in range of 100 s~280 s. An upper limit of the air permeability can be 280 s, 270 s, 260 s, 250 s, 240 s, 230 s, 220 s, 210 s, 200 s, or 190 s; and a lower limit of the air permeability can be 100 s, 110, 120 s, 130 s, 140 s, 150 s, 160 s, 170 s, or 180 s. The range of the air permeability of the separator can be constituted by any of the upper limits and any of the lower limits.

The air permeability (Gurley) of the separator is an important parameter for determining the ion conductivity of the separator. When the inorganic layer is an ultra-thin film having a thickness of only tens of nanometers, the inorganic layer is mainly deposited on the surface of the substrate and a portion of the inner walls of the pores. The pore diameter decreases as the thickness of the inorganic layer increases. With the gradual increase of the thickness of the inorganic layer, the inorganic layer begins to form a continuous film layer on the surface of the substrate that covers the pores, and at this time, lithium-ions need to pass through the inorganic layer before entering into the substrate of the separator. In the embodiments of the present disclosure, the favorable ion conduction performance of the separator and the favorable dynamic and rate performances of the electrochemical device can be effectively ensured by regulating the relative contents of the inorganic layer and the substrate, the thickness and porosity of the inorganic layer, and the pore diameter and porosity of the substrate, controlling the air permeability to be in the range of 100 s~280 s.

As an improvement to the separator of the embodiments of the present disclosure, when the separator is separately placed at 90° C. for one hour, both a longitudinal thermal shrinkage percentage and a transverse thermal shrinkage percentage are lower than 3%, for example, 2.8%, 2.5%, 2%, 1.8%, 1.5%, 1.2%, 1%, 0.8%, 0.5%, 0.3%, etc. Preferably, both the longitudinal thermal shrinkage percentage and the transverse thermal shrinkage percentage are lower than 2%, more preferably lower than 1%.

A second aspect of the embodiments of the present disclosure provides a method for prepared the separator. The method includes at least steps of: providing a substrate, which is a porous substrate; and forming an inorganic layer on a surface of the substrate and in the pores by using vapor deposition method, so as to obtain the separator. The inorganic layer has a thickness of 20 nm to 2000 nm. A mass of the inorganic layer is M1, a mass of the substrate is M2, and a mass ratio of the inorganic layer to the substrate M1/M2 is greater than or equal to 0.05 but smaller than or equal to 7.5. An interfacial peeling force between the inorganic layer and the substrate is not smaller than 30 N/m.

By using the vapor deposition method to form the inorganic layer, the inorganic layer not only can be deposited on the surface of the substrate, but also can be deposited on a portion of the inner walls of the pores in the substrate. As the coating area percentage of the inorganic layer on the substrate increases, the inhibition effect against the thermal shrinkage of the substrate by the inorganic layer becomes more significant, and the tensile strength and puncture strength of the separator can be also increased, thereby effectively improving safety performance of the battery. Since no binder is used, the problems of cracks and fall-off of the inorganic layer caused by the uneven distribution of the binder can be avoided, therefore the decrease of mechanical strength and blocking pores of the substrate caused by the fall-off can be also avoided, thereby enhancing the ion conductivity of the separator and further improving safety performance of the battery and extending the cycle life of the battery.

As an improvement to the method for preparing the separator of the embodiments of the present disclosure, the method further includes performing surface pretreatment on the substrate prior to forming the inorganic layer. The surface pretreatment includes one or more of plasma activation, corona pretreatment, chemical pretreatment, or electron beam pretreatment, and preferably, the surface pretreatment is plasma activation or electron beam pretreatment. Prior to the deposition of the inorganic layer, high energy plasma or electron beam can be used to bombard the surface of the substrate. This can increase roughness of the substrate while activating function groups on the surface for increasing the deposition speed, and can modify micro morphology such as the porosity and pore diameter of the inorganic layer by adjusting process parameter during preparing the inorganic layer.

As an improvement to the method for preparing the separator of the embodiments of the present disclosure, the vapor deposition is a coating process selected from a group consisting of atomic layer deposition, chemical vapor deposition, physical vapor deposition, thermal evaporation, or any combination thereof. Preferably, plasma assisted thermal evaporation deposition, reactive ion beam sputtering deposition, electron beam evaporation, magnetron sputtering method, or plasma arc plating method can be employed.

As an improvement to the method for preparing the separator of the embodiments of the present disclosure, the vapor deposition includes a step of forming the inorganic layer by reaction of a reactive gas and a gaseous precursor of the inorganic layer.

As an improvement to the method for preparing the separator of the embodiments of the present disclosure, the reactive gas is at least one of oxygen, ozone, carbon dioxide, water vapor, nitric oxide, nitrogen dioxide, or ammonia.

As an improvement to the method for preparing the separator of the embodiments of the present disclosure, the precursor of the inorganic layer is at least one of elementary aluminum, aluminum alloy, alkyl aluminum, aluminum nitrate, aluminum acetate, aluminum sulfate, elementary silicon, silicon alloy, alkyl silicon, silicon nitrate, silicon acetate, silicon sulfate, elementary titanium, titanium alloys, alkyl titanium, titanium nitrate, titanium acetate, titanium sulfate, elementary zinc, zinc alloy, alkyl zinc, zinc nitrate, zinc acetate, zinc sulfate, elementary magnesium, magnesium alloy, alkyl magnesium, magnesium nitrate, magnesium acetate, magnesium sulfate, elementary zirconium, zirconium alloy, alkyl zirconium, zirconium nitrate, zirconium acetate, zirconium sulfate, elementary calcium, calcium alloy, alkyl calcium, calcium nitrate, calcium acetate, calcium sulfate, elementary barium, barium alloy, alkyl barium, barium nitrate, barium acetate, or barium sulfate.

A third aspect of the embodiments of the present disclosure provides an electrochemical device. The electrochemical device includes a positive electrode, a negative electrode, a separator according to the first aspect of the embodiments of the present disclosure, and electrolyte. The electrochemical device of the embodiments of the present disclosure can be a lithium-ion secondary battery, a lithium primary battery, a sodium ion battery, or a magnesium ion battery, but is not limited herein.

The lithium-ion secondary battery is taken as an example to further illustrate the embodiments of the present disclosure.

Separator

In the embodiments of the present disclosure, the material of the substrate is not particularly limited, and can be a polymer that can be selected from a group consisting of polyethylene, polypropylene, ethylene-propylene copolymer, or any combination thereof.

As for the method for preparing the inorganic layer of the separator, the plasma-assisted thermal evaporation deposition technology is taken as an example. A heating source is an electron beam, and a heating target material is an elementary substance except oxygen, such as Al, Si, Mg, or the like. Under vacuum conditions, an oxygen-containing active gas (such as oxygen, ozone, oxygen ions, nitric oxide, nitrogen dioxide, carbon dioxide, water vapor, etc.) is used as a reaction gas, and temperature of the substrate is controlled to be lower than 100° C. By adjusting current for heating and evaporation (10 A to 300 A), vacuum degree of a process chamber ($10^{-1}$ Pa to $10^{-3}$ Pa), oxygen flow rate (100 sccm to 2000 sccm), plasma power (300 W to 600 W) and process time, deposition rate of the inorganic layer on the surface of the substrate can be adjusted, and further, a thickness, composition, and micro morphology of the inorganic layer can be adjusted.

Preparation of Positive Electrode Plate

A positive electrode active material, a conductive agent of acetylene black (SP), and a binder of polyvinylidene fluoride (PVDF) are mixed at a weight ratio of 96:2:2. Solvent of N-methylpyrrolidone is added and then mixed and stirred evenly to obtain positive electrode slurry. The positive electrode slurry is evenly coated on the positive electrode current collector aluminum foil and then dried at 85° C. Thereafter, cold pressing, edge-cutting, slitting, and stripping are performed, followed by drying at 85° C. under vacuum for 4 hours, so that the positive electrode plate is obtained. Additionally, the used positive electrode active material can be a layered lithium transition metal oxide, lithium-rich manganese oxide, lithium iron phosphate, lithium cobaltate, or a doped or coated positive electrode active material thereof. In this embodiment, the layered lithium transition metal oxide $LiNi_{0.8}Co_{0.1}Mn_{0.1}O_2$ is taken as an example.

Preparation of Negative Electrode Plate

A negative electrode active material of artificial graphite, a conductive agent of acetylene black, a binder of styrene butadiene rubber (SBR) and a thickener of sodium carboxymethyl cellulose (CMC) are mixed with at weight ratio of 96:1:2:1. Solvent of deionized water is added and then mixed and stirred evenly to obtain negative electrode slurry. The negative electrode slurry is evenly coated on the negative electrode current collector copper foil and then dried at 80° C. to 90° C. Thereafter, cold pressing, edge-cutting, slitting, and stripping are performed, followed by drying at 110° C. under vacuum for 4 hours, so that the negative electrode plate is obtained.

Preparation of Electrolyte

A basic electrolyte solution including dimethyl carbonate (DMC), ethyl methyl carbonate (EMC) and ethylene carbonate (EC) with a weight ratio of 5:2:3 is prepared. Then electrolyte salt is added so that concentration of lithium hexafluorophosphate in the electrolyte solution is 1 mol/L.

Preparation of Lithium Ion Battery

The negative electrode plate, the separator and the positive electrode plate are stacked in this order that the separator is placed between the positive electrode plate and the negative electrode plate and the surface of the separator with coating faces the positive electrode plate, and are wound to form a square bare cell with a thickness of 8 mm, a width of 60 mm, and a length of 130 mm. The bare cell is placed into an aluminum foil packing bag, and vacuum baked at 75° C. for 10 hours, and then, non-aqueous electrolyte is injected. After vacuum encapsulation is conducted, let it stand by for 24 hours. Then, it is charged to 4.2V with a constant current of 0.1 C (160 mA), and after that, it is charged at a constant voltage of 4.2V until the current drops to 0.05 C (80 mA). Then it is discharged to 3.0V with the constant current of 0.1 C (160 mA). After the charge-discharge is repeated for two times, it is charged to 3.8V with the constant current of 0.1 C (160 mA). In this way, preparation of the lithium-ion secondary battery is completed.

Embodiments

Lithium ion secondary batteries can be prepared by the above method. Specifically, the plasma-assisted thermal evaporation deposition is used to deposit an inorganic layer having certain parameters on the upper and lower surfaces of the porous substrate by vapor deposition method.

The specific process parameters are illustrated as follows. The target material is metal aluminum (in which other element such as Si may be doped), the vacuum degree of the deposition chamber is smaller than $1\times10^{-3}$ Pa, the heating current is 190 A, the oxygen flow rate is 300 sccm, the plasma power is about 300 W, the active reaction gas is oxygen, and the process time is 5 min.

Specific parameters of the prepared separators are shown in Table 1.

double-sided adhesive in a width of 2 cm. The sample was peeled from the steel plate by using a tensionmeter. The maximum pulling force F (N) was read according to a data chart of the pulling force and the displacement. The measured force was F/0.02.

(2) Test for Thermal Shrinkage Percentage of the Separator

The composite separator was cut into a square sample of 100 mm in length and 100 mm in width, and marked with a longitudinal direction (MD) and a transverse direction (TD). After that, a projection tester was used to measure the lengths in the MD and TD directions and the lengths were recorded as L1 and L2. The separator was then placed in an air-circulating oven at 150° C. for one hour and then taken out. The projection tester was used again to measure the lengths in the MD and TD directions and these lengths were recorded as L3 and L4.

Thermal shrinkage percentage of the separator in the MD direction=$(L1-L3)/L1\times100\%$.

Thermal shrinkage percentage of the separator in the TD direction=$(L2-L4)/L2\times100\%$.

(3) Test for Tensile Strength of the Separator

The test sample with a fixed thickness of T was respectively die-cut along MD (length direction)/TD (width direction) using the cutting die to form sheets with a size of 100 mm×15 mm. Then, the sheet was placed to be perpendicular to a clamping chuck of the tensionmeter, and was fixed and tightened with upper and lower chucks with both initial

TABLE 1

| | Inorganic Layer | | Substrate | | | | |
|---|---|---|---|---|---|---|---|
| No. | Thickness nm | Porosity | Thickness μm | Pore diameter μm | Porosity | M1/M2 | d |
| Separator 1 | 20 | 20% | 15 | 0.06 | 40% | 0.07 | 1/800 |
| Separator 2 | 50 | 15% | 10 | 0.05 | 45% | 0.30 | 1/500 |
| Separator 3 | 100 | 20% | 15 | 0.07 | 45% | 0.38 | 1/420 |
| Separator 4 | 200 | 25% | 12 | 0.06 | 40% | 0.81 | 1/210 |
| Separator 5 | 300 | 30% | 18 | 0.06 | 45% | 0.82 | 1/111 |
| Separator 6 | 500 | 35% | 13 | 0.08 | 50% | 1.26 | 1/85 |
| Separator 7 | 800 | 40% | 15 | 0.07 | 45% | 1.35 | 1/63 |
| Separator 8 | 1000 | 38% | 18 | 0.06 | 40% | 2.22 | 1/50 |
| Separator 9 | 1500 | 40% | 20 | 0.06 | 50% | 3.48 | 1/40 |
| Separator 10 | 2000 | 35% | 13 | 0.06 | 40% | 6.45 | 1/25 |
| Separator 11 | 500 | 5% | 15 | 0.06 | 50% | 2.45 | 1/80 |
| Separator 12 | 500 | 20% | 15 | 0.07 | 55% | 4.13 | 1/83 |
| Separator 13 | 500 | 60% | 10 | 0.08 | 50% | 1.03 | 1/80 |
| Separator 14 | 500 | 70% | 15 | 0.10 | 55% | 0.86 | 1/84 |
| Separator 15 | 500 | 38% | 5 | 0.06 | 45% | 4.36 | 1/20 |
| Separator 16 | 500 | 30% | 30 | 0.10 | 60% | 1.13 | 1/150 |
| Separator 17 | 500 | 30% | 45 | 0.06 | 50% | 0.60 | 1/300 |
| Separator 18 | 500 | 30% | 55 | 0.15 | 60% | 0.62 | 1/700 |
| Separator 19 | 500 | 30% | 20 | 0.07 | 60% | 1.69 | 1/60 |
| Separator 20 | 500 | 30% | 20 | 0.06 | 20% | 0.85 | 1/150 |
| Separator 21 | 500 | 30% | 20 | 0.05 | 80% | 3.39 | 1/30 |
| Separator D1 | — | — | 18 | 0.06 | 40% | — | — |
| Separator D2 | 8 | 15% | 20 | 0.05 | 42% | 0.02 | 1/5000 |
| Separator D3 | 2250 | 40% | 13 | 0.06 | 50% | 8.04 | 1/59 |
| Separator D4 | 20 | 30% | 50 | 0.06 | 55% | 0.02 | 1/3000 |
| Separator D5 | 2000 | 32% | 5 | 0.05 | 40% | 17.55 | — |

In Table 1, "—" indicates that the corresponding layer is absent.

Test procedures and test results of the separators and the lithium-ion secondary batteries will be described in detail below.

(1) Interfacial Peeling Force Test

Under room temperature and normal pressure conditions, 3M double-sided adhesive was evenly attached to a stainless steel plate, and then a test sample was evenly attached to the heights of 5 cm. A tensile rate is set to be 50 mm/min, and the maximum pulling force measured is F.

Tensile strength=$F/9.8/(15\text{ mm}\times T)$ (4) Test for Air Permeability of the Separator Under a temperature of 15° C. to 28° C. and a humidity lower than 80%, the test sample was made into a size of 4 cm×4 cm, and an air permeability value was directly obtained using an Air-permeability-tester with Gurley test (100 cc) method.

(5) Test for Wettability of Separator

The test sample was placed on the water contact angle tester. A drop of deionized water was dropped on the test sample from a height of ≤1 mm above the test sample, the water drop on the test sample was then photographed by an optical microscope and a high speed camera, and an inclined angle between a tangent line of the water drop to a contact point of the test sample was measured and analyzed by software.

The tested results of physical properties of the separators are shown in Table 2.

(6) Test for Capacity of the Lithium-Ion Secondary Battery

In an incubator at 25° C., the battery was charged to a voltage of 4.2V at a constant current with a rate of 1 C, and then charged at a constant voltage of 4.2V to a current of 0.05 C. After that, it was discharged to a voltage of 2.8V at a constant current with a rate of 1 C, and in this way, the obtained discharge capacity was the capacity of the battery.

(7) Test for Cycling Performance at Ambient Temperature of the Lithium-Ion Secondary Battery At 25° C., the battery was charged to a voltage of 4.2V at a constant current with a rate of 0.7 C, and then it was charged with a constant voltage of 4.2V to a current of 0.05 C. After that, it was discharged at a constant current of 1 C to a voltage of 2.8V. This is a charge-discharge cycle process, and this charge-discharge cycle process was repeated 1000 times.

A capacity retention rate after the 1000 cycles=discharge capacity after the $1000^{th}$ cycle/discharge capacity after the first cycle×100%.

(8) Test for High Temperature Storage and Gas Generation

Five batteries were selected respectively from the batteries of each embodiment and each comparative example. Each battery was charged to a voltage higher than 4.2V under a room temperature at a constant current with a rate of 0.3 C, and then charged with a constant voltage of 4.2V to a current lower than 0.05 C, so that the battery was in a fully charged state with a voltage of 4.2V. An internal pressure of the fully charged battery before storage was measured and denoted as $P_0$. The fully charged battery was stored in an oven at 80° C. for 15 days, and then taken out and cooled for 1 hour, and subsequently, an internal pressure of the battery was measured and denoted as $P_n$.

A pressure change value of the battery before and after storage was calculated according to the formula: $\Delta P = P_n - P_0$.

The test results of the electrochemical properties of the lithium ion secondary batteries prepared by using the above separators are specifically shown in Table 3.

TABLE 2

Physical properties of separators

| No. | Interfacial Peeling Force (N) | Thermal Shrinkage Percentage MD (%) | TD (%) | Tensile Strength MD direction (kgf/cm²) | TD direction (kgf/cm²) | Air Permeability (s) | Wettability (°) |
|---|---|---|---|---|---|---|---|
| Separator 1 | 34 | 1.56 | 0.19 | 1268 | 1349 | 112 | 50 |
| Separator 2 | 34 | 1.43 | −0.12 | 1372 | 1368 | 128 | 40 |
| Separator 3 | 39 | 0.98 | −0.09 | 1221 | 1258 | 126 | 20 |
| Separator 4 | 39 | 0.96 | −0.13 | 1306 | 1333 | 133 | 15 |
| Separator 5 | 37 | 0.63 | −0.11 | 1341 | 1241 | 132 | 0 |
| Separator 6 | 35 | 0.61 | −0.08 | 1330 | 1293 | 147 | 0 |
| Separator 7 | 32 | 0.56 | 0.20 | 1330 | 1389 | 186 | 0 |
| Separator 8 | 33 | 0.48 | −0.18 | 1324 | 1209 | 180 | 0 |
| Separator 9 | 34 | 0.50 | 0.01 | 1366 | 1277 | 183 | 0 |
| Separator 10 | 32 | 0.61 | 0.07 | 1264 | 1388 | 188 | 0 |
| Separator 11 | 39 | 0.49 | −0.12 | 1398 | 1311 | 281 | 0 |
| Separator 12 | 31 | 0.61 | −0.09 | 1226 | 1368 | 183 | 0 |
| Separator 13 | 35 | 0.51 | 0.02 | 1389 | 1365 | 130 | 0 |
| Separator 14 | 34 | 0.53 | −0.08 | 1363 | 1345 | 122 | 0 |
| Separator 15 | 31 | 0.52 | −0.01 | 1311 | 1398 | 188 | 0 |
| Separator 16 | 38 | 0.53 | −0.03 | 1271 | 1203 | 180 | 0 |
| Separator 17 | 32 | 0.85 | 0.05 | 1292 | 1249 | 187 | 0 |
| Separator 18 | 33 | 0.58 | 0.10 | 1308 | 1280 | 186 | 0 |
| Separator 19 | 37 | 0.49 | 0.20 | 1232 | 1387 | 183 | 0 |
| Separator 20 | 34 | 0.54 | 0.07 | 1254 | 1229 | 290 | 0 |
| Separator 21 | 38 | 0.43 | −0.14 | 1272 | 1335 | 188 | 0 |
| Separator D1 | — | 2.30 | 0.40 | 1049 | 1119 | 92 | 120 |
| Separator D2 | 35 | 2.34 | 0.05 | 1138 | 1112 | 112 | 65 |
| Separator D3 | 25 | 0.51 | 0.02 | 1289 | 1365 | 320 | 0 |
| Separator D4 | 33 | 2.20 | 0.37 | 1305 | 1373 | 180 | 55 |
| Separator D5 | 40 | 0.21 | 0.05 | 1150 | 1204 | 350 | 0 |

TABLE 3

Electrochemical properties of separators

| No. | | Battery Capacity (mAh) | Capacity Retention Rate after 1000 Cycles (%) | Average Pressure Change (MPa) |
|---|---|---|---|---|
| Battery 1 | Separator 1 | 1697 | 90.90% | 0.446 |
| Battery 2 | Separator 2 | 1690 | 89.30% | 0.321 |
| Battery 3 | Separator 3 | 1684 | 89.20% | 0.222 |
| Battery 4 | Separator 4 | 1680 | 90.20% | 0.172 |

TABLE 3-continued

Electrochemical properties of separators

| No. | | Battery Capacity (mAh) | Capacity Retention Rate after 1000 Cycles (%) | Average Pressure Change (MPa) |
|---|---|---|---|---|
| Battery 5 | Separator 5 | 1681 | 91.10% | 0.141 |
| Battery 6 | Separator 6 | 1663 | 92.90% | 0.211 |
| Battery 7 | Separator 7 | 1645 | 90.50% | 0.216 |
| Battery 8 | Separator 8 | 1654 | 90.10% | 0.172 |
| Battery 9 | Separator 9 | 1658 | 90.90% | 0.521 |
| Battery 10 | Separator 10 | 1656 | 88.50% | 0.129 |
| Battery 11 | Separator 11 | 1668 | 88.16% | 0.121 |
| Battery 12 | Separator 12 | 1663 | 90.21% | 0.138 |
| Battery 13 | Separator 13 | 1668 | 90.30% | 0.159 |
| Battery 14 | Separator 14 | 1663 | 90.92% | 0.230 |
| Battery 15 | Separator 15 | 1689 | 90.24% | 0.137 |
| Battery 16 | Separator 16 | 1654 | 90.52% | 0.155 |
| Battery 17 | Separator 17 | 1638 | 91.00% | 0.146 |
| Battery 18 | Separator 18 | 1601 | 91.20% | 0.145 |
| Battery 19 | Separator 19 | 1651 | 91.06% | 0.140 |
| Battery 20 | Separator 20 | 1648 | 88.24% | 0.120 |
| Battery 21 | Separator 21 | 1643 | 90.37% | 0.121 |
| Battery D1 | Separator D1 | 1662 | 87.81% | 0.514 |
| Battery D2 | Separator D2 | 1622 | 88.82% | 0.508 |
| Battery D3 | Separator D3 | 1608 | 88.30% | 0.149 |
| Battery D4 | Separator D4 | 1610 | 90.10% | 0.432 |
| Battery D5 | Separator D5 | 1640 | 87.40% | 0.211 |

It can be seen from the above embodiments and comparative examples that when the separator is not provided with the inorganic layer, the separator has high thermal shrinkage percentage and poor wettability, resulting in poor electrochemical performance (please refer to D1). When the mass ratio of M1/M2 is too small, the amount of the inorganic layer relative to the amount of the porous substrate is small and the protected area of the substrate is low, and therefore, when heated, the inhibition effect against the thermal shrinkage of the separator by the inorganic layer is not significant while mechanical strength (such as tensile strength and puncture strength) of the composite separator is low (please refer to D2 and D4). If the inorganic layer is too thick, M1/M2 is too large, the improvement effect for hydrophilicity, thermal shrinkage resistance, mechanical strength is not significant enhanced either, and with the increase of the thickness of the separator, the dynamic performance and energy density of the battery can be reduced instead (please refer to D3 and D5).

Although the present disclosure is disclosed with the preferred embodiments above, these embodiments are not intended to limit the claims, and any person skilled in the art may make several possible changes and modifications without departing from the conception of the present disclosure. Therefore, the protection scope of the present disclosure should be defined by the scope of the claims of the present disclosure.

What is claimed is:

1. A separator, comprising
a substrate with a porous structure, and
an inorganic layer disposed on at least one side of the substrate,
wherein the inorganic layer is a dielectric layer containing no binder and formed by a vapor deposition, the inorganic layer has a thickness of 20 nm to 2000 nm, a mass of the inorganic layer is M1, a mass of the substrate is M2, a mass ratio of the inorganic layer to the substrate is M1/M2 and M1/M2 is greater than or equal to 0.05 but smaller than or equal to 7.5, and an interfacial peeling force between the inorganic layer and the substrate is larger than or equal to 30 N/m, a ratio d of a depth of the inorganic layer in the pores of the substrate to the thickness of the substrate is 1/1000 to 1/20.

2. The separator according to claim 1, wherein the inorganic layer has a thickness of 50 nm to 1500 nm.

3. The separator according to claim 1, wherein the inorganic layer is a porous structure of stacked nanoclusters, and the inorganic layer has a porosity of 10% to 60%.

4. The separator according to claim 1, wherein the inorganic layer is disposed on at least one surface of the substrate and at least a portion of inner walls of the pores of the substrate.

5. The separator according to claim 1, wherein the inorganic layer contains at least one of aluminum oxide, aluminum nitride, aluminum fluoride, silicon oxide, silicon nitride, silicon fluoride, titanium oxide, titanium nitride, titanium fluoride, zinc oxide, zinc nitride, zinc fluoride, magnesium oxide, magnesium nitride, magnesium fluoride, zirconium oxide, zirconium nitride, zirconium fluoride, calcium oxide, calcium nitride, calcium fluoride, barium oxide, barium nitride, barium fluoride, or AlO(OH).

6. The separator according to claim 1, wherein the substrate contains a material selected from a group consisting of polyethylene, polypropylene, polyvinylidene fluoride, aramid fiber, polyethylene glycol terephthalate, polytetrafluoroethylene, polyacrylonitrile, polyimide, polyamide, polyester, natural fiber, or any combination thereof;
a porosity of the substrate is 20% to 80%; and
a thickness of the substrate is 5 μm to 50 μm.

7. The separator according to claim 1, wherein the substrate has an average pore diameter of 0.01 μm to 0.5 μm.

8. The separator according to claim 1, wherein the separator has an air permeability of 100 s to 280 s.

9. The separator according to claim 1, wherein after the separator is placed at 90° C. for one hour, both a longitudinal thermal shrinkage percentage and a transverse thermal shrinkage percentage of the separator are lower than 3%.

10. A method of preparing the separator according to claim 1, comprising at least steps of:
providing the substrate, the substrate being a porous substrates; and
forming the inorganic layer on at least one surface of the substrate and at least a part of pores of the substrate by a vapor deposition,
wherein, in the vapor deposition, a mass M1 of the inorganic layer and a mass M2 of the substrate are controlled to satisfy 0.05≤M1/M2≤7.5, a ratio d of a depth of the inorganic layer in the pores of the substrate to the thickness of the substrate is controlled to be 1/1000 to 1/20, the formed inorganic layer has a thickness of 20 nm to 2000 nm, and an interfacial peeling force between the formed inorganic layer and the substrate is larger than or equal to 30 N/m.

11. The method for preparing the separator according to claim 10, wherein the method further comprises performing a surface pretreatment on the substrate prior to forming the inorganic layer, wherein the surface pretreatment comprises one or more of plasma activation, corona pretreatment, chemical pretreatment, or electron beam pretreatment.

12. The method for preparing the separator according to claim 10, wherein the vapor deposition method is a coating process selected from a group consisting of atomic layer deposition, chemical vapor deposition, physical vapor deposition, thermal evaporation, or any combination thereof.

13. An electrochemical device, comprising a positive electrode, a negative electrode, a separator, and electrolyte, wherein the separator is the separator according to claim 1.

14. The method according to claim 10, wherein the vapor deposition comprises a step of forming the inorganic layer by reaction of a reactive gas and a gaseous precursor of the inorganic layer.

15. The method according to claim 14, wherein the reactive gas is at least one of oxygen, ozone, carbon dioxide, water vapor, nitric oxide, nitrogen dioxide, or ammonia.

16. The method according to claim 10, wherein, during the vapor deposition, an oxygen flow rate ranges from 100 sccm to 2000 sccm.

17. The method according to claim 11, wherein the surface pretreatment is plasma activation or electron beam pretreatment.

18. The separator according to claim 6, wherein the porosity of the substrate is 40% to 70%.

19. The separator according to claim 6, wherein the thickness of the substrate is 7 μm to 20 μm.

20. The separator according to claim 9, wherein after the separator is placed at 90° C. for one hour, both the longitudinal thermal shrinkage percentage and the transverse thermal shrinkage percentage of the separator are lower than 1%.

\* \* \* \* \*